(12) United States Patent
Hoofman et al.

(10) Patent No.: US 9,034,493 B2
(45) Date of Patent: May 19, 2015

(54) INTEGRATED BATTERY AND IC

(75) Inventors: Romano Hoofman, Geel (BE); Coen Tak, Waalre (NL); Marc Andre De Samber, Lommel (BE)

(73) Assignee: NXP B.V., Eindhoven (NL)

( * ) Notice: Subject to any disclaimer, the term of this patent is extended or adjusted under 35 U.S.C. 154(b) by 564 days.

(21) Appl. No.: 12/953,980

(22) Filed: Nov. 24, 2010

(65) Prior Publication Data

US 2011/0293969 A1 Dec. 1, 2011

(30) Foreign Application Priority Data

Nov. 26, 2009 (EP) .................................... 09177184

(51) Int. Cl.
*H01L 23/498* (2006.01)
*H01L 23/14* (2006.01)
*H01L 23/58* (2006.01)
*B81C 1/00* (2006.01)
*H01M 10/04* (2006.01)
*H01L 23/00* (2006.01)
*H01M 10/0562* (2010.01)
*H01M 10/46* (2006.01)

(52) U.S. Cl.
CPC ... *H01L 23/49855* (2013.01); *B81B 2201/0235* (2013.01); *B81B 2207/015* (2013.01); *B81B 2207/03* (2013.01); *B81C 1/00246* (2013.01); *H01L 23/145* (2013.01); *H01L 23/58* (2013.01); *H01L 24/16* (2013.01); *H01L 24/48* (2013.01); *H01L 2924/14* (2013.01); *H01M 10/0436* (2013.01); *H01M 10/0562* (2013.01); *H01M 10/46* (2013.01); *H01L 2224/48* (2013.01); *H01L 2924/1461* (2013.01)

(58) Field of Classification Search
None
See application file for complete search history.

(56) References Cited

U.S. PATENT DOCUMENTS 6,593,669 B1 7/2003 Lemaire et al.
2004/0217865 A1 * 11/2004 Turner ....................... 340/572.7

FOREIGN PATENT DOCUMENTS

| EP | 0 971 410 A2 | 1/2000 |
| EP | 1 465 279 A1 | 10/2004 |
| EP | 1 467 314 A1 | 10/2004 |
| WO | 00/62365 A1 | 10/2000 |
| WO | 2006/121917 A1 | 11/2006 |

OTHER PUBLICATIONS

Extended European Search Report for Patent Appln. No. 09177184.0 (Jul. 8, 2010).

* cited by examiner

*Primary Examiner* — Sarah A Slifka

(57) ABSTRACT

Consistent with an example embodiment, there is an apparatus comprising a carrier, a laminated battery provided on a major surface of the carrier, and an integrated circuit. The laminated battery includes a bottom electrode layer, an electrolyte layer, and a top electrode layer. The integrated circuit is connected to the bottom electrode layer and the top electrode layer. The integrated circuit is surrounded by the laminated battery on the major surface of the carrier.

17 Claims, 3 Drawing Sheets

__US 9,034,493 B2__

INTEGRATED BATTERY AND IC

This application claims the priority under 35 U.S.C. §119 of European patent application no. 09177184.0, filed on Nov. 26, 2009, the contents of which are incorporated by reference herein.

BACKGROUND OF THE INVENTION

This invention relates to a laminated battery and an integrated circuit (IC), provided together on a carrier.

It is known to incorporate batteries (such as thin film batteries) into products such as semi-active or battery-assisted radio-frequency identification (RFID) tags. These devices make use of the battery power to extend the reach the tag by strengthening the RF signal.

A number of arrangements have been proposed for the layout of a battery and an integrated circuit (IC) on a carrier in an RFID tag.

WO2006/121917 A1 titled, "RFID Antenna-Battery Assembly and the Method to Make the Same (published 16 NOV 2006)," of Gary Tucholski, describes the provision of a cell/battery and an IC chip on a substrate. While the IC chip is located on a top side of the substrate, the cell/battery is provided on the opposite side, and vias are provided through the substrate, to make electrical connections from the cell/battery to the IC chip.

EP 1 467 314 A1 titled, "RFID Tag Comprising a Battery and an Antenna Sharing Common Elements (filed on 4 Oct. 2003)," of Christopher Turner, describes an RFID tag comprising a battery, an antenna and a transponder integrated circuit. These components are all provided on a base or substrate. The battery is located to one side of the integrated circuit, on the base or substrate.

There is a need to provide an alternative construction, which may be more compact than those known.

SUMMARY OF THE INVENTION

Aspects of the invention are set out in the accompanying independent and dependent claims. Combinations of features from the dependent claims may be combined with features of the independent claims as appropriate and not merely as explicitly set out in the claims.

According to an example embodiment, there is an apparatus comprising a laminated battery provided on a major surface of a carrier; the laminated battery comprises a bottom electrode layer, an electrolyte layer, and a top electrode layer. An integrated circuit (IC) is connected to the bottom electrode layer and the top electrode layer. The integrated circuit is located in an opening in the laminated battery and is surrounded by the laminated battery on the major surface of the carrier. A portion of the bottom electrode layer and a portion of the top electrode layer each extend into the opening to connect with the integrated circuit.

The arrangement of the integrated circuit, surrounded by the laminated battery on the same surface (namely the major surface) of the carrier, constitutes a compact construction.

The IC is located in an opening provided in the laminated battery. A portion of the bottom electrode layer and a portion of the top electrode layer can each extend into the opening to connect to the integrated circuit. In one embodiment, there is provided a flip-chip arrangement, in which the integrated circuit is reverse-mounted on current collectors provided on the major surface of the carrier.

In some examples, the IC can include a sensor, such as an accelerometer, a gyroscope, a PH sensor, gas sensor, or a temperature sensor.

For sensors which do not expressly require access to the surrounding environment to perform their sensing function, either the embedded design or the open design (where the IC is positioned in an opening or aperture in the battery) can be used. On the other hand, the open design should be used for sensors for which access to surrounding environment is required.

In one embodiment, an isolation layer can be located between the carrier and the bottom electrode of the laminated battery.

The carrier can, for example, include a Polyethylene terephthalate (PET), polyaryletheretherketone (PEEK), Polyvinyl chloride (PVC) or Polyimide foil.

According to embodiment, there is provided a radio-frequency identification (RFID) tag comprising an apparatus of the kind described above.

According to another embodiment, there is provided a microelectromechanical system (MEMS) device comprising an apparatus of the kind described above.

BRIEF DESCRIPTION OF THE DRAWINGS

Embodiments of the present invention will be described hereinafter, by way of example only, with reference to the accompanying drawings in which like reference signs relate to like elements and in which.

DETAILED DESCRIPTION

Embodiments of the invention are described in the following with reference to the accompanying drawings.

Figure 1:
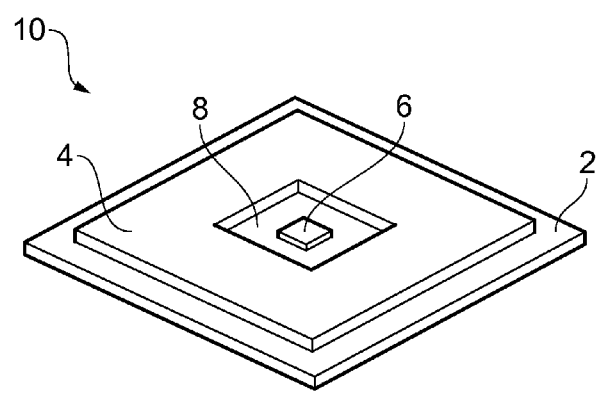
FIGS. 1 to 6 each schematically illustrate an apparatus according to an embodiment of the invention.

A first embodiment of the invention is illustrated in FIG. 1. In this embodiment, there is provided an apparatus 10 which comprises a laminated battery 4 provided on a major surface of a carrier 2. The carrier 2 may, for example, comprise part of a radio-frequency identification (RFID) tag or micro-electromechanical system (MEMS). The carrier 2 can be formed using any suitable material, examples of which include Polyethylene terephthalate (PET), polyaryletheretherketone (PEEK), Polyvinyl chloride (PVC) or Polyimide foil.

The apparatus 10 also includes an integrated circuit 6, which may also form part of an RFID tag or micro-electromechanical system (MEMS). The integrated circuit 6 can comprise a semiconductor substrate such as a semiconductor die manufactured according to standard semiconductor processing techniques. The integrated circuit 6 can be provided to enable functionality such as the storage and/or processing of data, the transmission and/or reception of such data via an antenna, which may also be provided on the carrier 2. As discussed in more detail below, the integrated circuit may also provide sensor functionality. As such, the integrated circuit 6 can include some form of sensor, such as a PH detector, a temperature detector, a gas sensor, a motion detector (accelerometer), an orientation detector, a magnetometer, or a light sensitive device such as one or more photodiodes.

As can be seen in FIG. 1, the integrated circuit 6 is surrounded by the laminated battery 4 on the major surface of the carrier 2. This arrangement/construction for the integrated circuit 6 and the laminated battery 4 on the carrier 2 constitutes a particularly compact construction. For example, the combined area on the carrier 2 occupied by the laminated battery 4 and the integrated circuit 6 does not exceed the area bounded by the outer perimeter of the laminated battery 4.

In the example shown in FIG. 1, the laminated battery comprises an opening 8, which accommodates the integrated circuit 6. In this way, the integrated circuit 6 is left exposed to the surrounding environment. In examples where the integrated circuit 6 includes a sensor, the opening 8 in the laminated battery 4 can allow the sensor to perform its sensing function without being inhibited by other components such as the electrodes or electrolytes of the laminated battery 4. For instance, in the case of a PH sensor, a photodiode, or a temperature sensor, it may be important for the integrated circuit 6 to have direct access to the surrounding environment.

Figure 2:
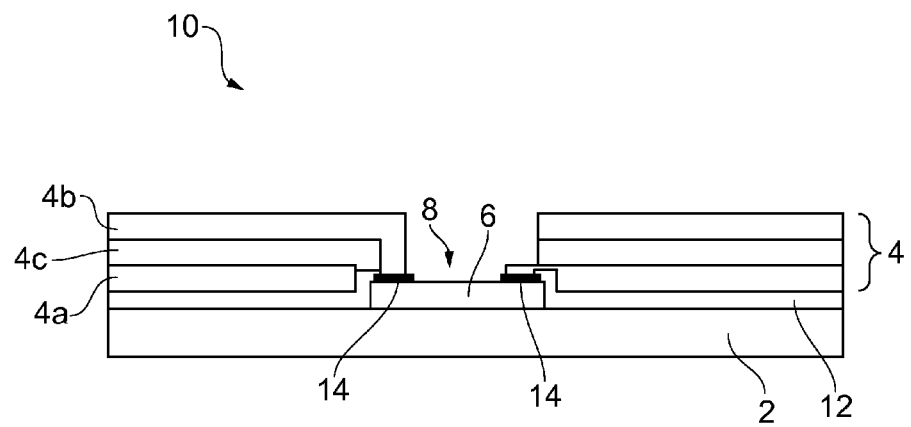

FIG. 2 is a cross-sectional view, showing the apparatus 10 in more detail.

As shown in FIG. 2, the apparatus 10 includes the carrier 2, the integrated circuit 6 and the laminated battery 4. The laminated battery 4 includes a number of layers. In this example, the layers of the laminated battery 4 include a bottom electrode layer 4a, a top electrode layer 4b and an electrolyte layer 4c. The electrode layers 4a and 4b of the laminated battery 4 typically comprise a conductive material such as some form of metal or metal alloy. The electrolyte layer 4c is located between the bottom electrode layer 4a and the top electrode layer 4b. The electrolyte layer 4c can, for example, comprise a solid electrolyte such as lithium phosphorus oxynitride (LiPON)

As also shown in FIG. 2, the apparatus 10 further includes an isolation layer 12 situated between the bottom electrode layer 4a and the carrier 2. The isolation layer 12 isolates the bottom electrode layer 4a from the material of the carrier 2, and can also provide a suitable surface for the deposition of the stack of layers 4a, 4b and 4c of the battery 4 during manufacture. The isolation layer 12 may, for example, comprise silicon nitride.

As described above, the integrated circuit 6 in this example is provided in an opening 8 in the laminated battery 4. To provide power to the integrated circuit 6, it is necessary to connect the bottom electrode 4a and the top electrode 4b to the integrated circuit 6. In this example, the integrated circuit 6 is provided with connection points 14, to which the electrode layers of the laminated battery 4 can be connected. In particular, and as shown in FIG. 2, a portion of the bottom electrode layer 4a extends into the opening 8 to make a connection with one of the connection points 14 of the integrated circuit 6. Similarly, a portion of the top electrode layer 4b extends into the opening 8 to connect to a connection point 14 of the integrated circuit 6. In order to make the latter connection, the top electrode layer 4b extends down over the electrolyte later 4c. The portions of the electrode layers which extend into the opening 8 in the laminated battery 4 may, for example, take the form of elongate finger which protruding from the electrode layers.

Figure 3:
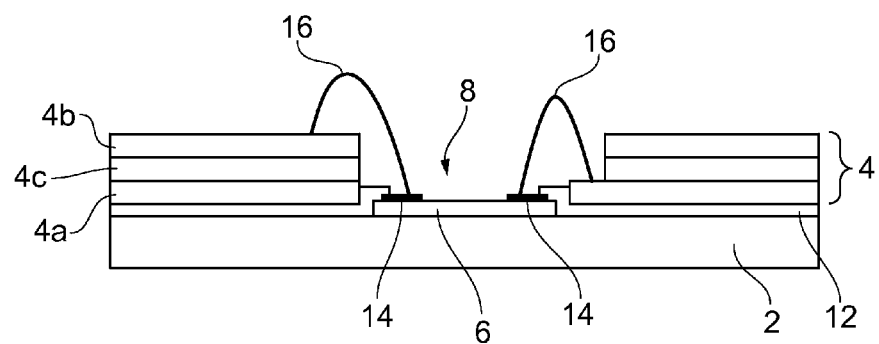

In an alternative example shown in FIG. 3, wire bonding techniques are used to provide wires 16 between the connection points 14 of the integrated circuit 6 and the respective electrode layers of the laminated battery 4. In FIG. 3, it is also shown that to provide a surface for connection of the bottom electrode layer 4a to a wire 16 of the apparatus 10, a recessed or cut-back area can be provided in the electrolyte layer 4c and the top electrode layer 4b.

Figure 4:
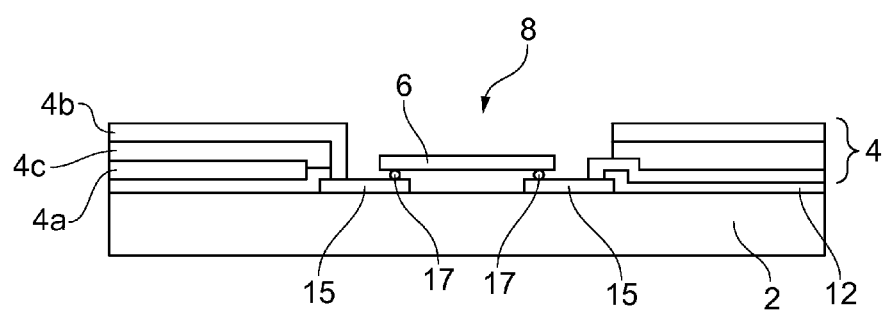

In a further example, shown in FIG. 4, a flip-chip arrangement is provided. In this example, current collectors 15 are provided on the major surface 2 of the carrier. The integrated circuit 6 is reverse-mounted to the current collectors 15 using connections 17. In a configuration analogous to that described above in relation to FIG. 2, portions of the electrode layers can extend into the opening 8 in the laminated battery 4 to connect to the current collectors 15 and thereby provide power to the reverse-mounted integrated circuit 6. As described above, the portions of the electrode layers which extend into the opening 8 can take the form of one or more elongate fingers.

Figure 5:
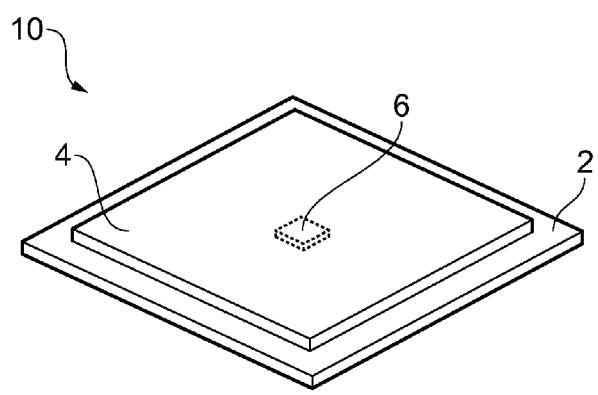
Figure 6:
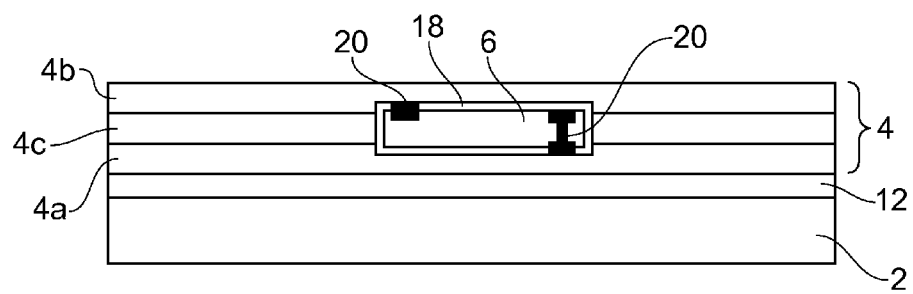

A further embodiment of the invention is now described in relation to FIGS. 5 and 6. In this embodiment, no opening is provided in the laminated battery 4. Instead, the integrated circuit 6 is embedded between the bottom electrode layer 4a and the top electrode layer 4b of the laminated battery 4. In this case, the integrated circuit 6 is not directly exposed to the surrounding environment and the integrated circuit 6 is provided at least some degree of protection by the layers of the laminated battery 4. Nevertheless, in common with the examples described above in relation to FIGS. 1-4, and as illustrated in FIGS. 5 and 6, the integrated circuit 6 is substantially surrounded by the laminated battery 4 on the major surface of the carrier 2.

As is shown in FIG. 6, in this embodiment, the laminated battery comprises a bottom electrode layer 4a, a top electrode layer 4b, and an electrolyte layer 4c. As before, the electrolyte layer 4c is located between the bottom electrode layer 4a and the top electrode layer 4b. The integrated circuit 6 in this example is also located between the bottom electrode layer 4a and the top electrode layer 4b. The electrolyte layer 4c shown in FIG. 6 is slightly thinner than the integrated circuit 6, whereby the integrated circuit 6 is received within respective recesses of the top 4b and bottom 4a electrode layers. In other examples, the electrolyte layer 4c may be the same thickness as the integrated circuit 6. Thus, the bottom electrode layer 4a can be laid down on the isolating layer 12 during manufacture, and the integrated circuit 6 can be mounted thereon. Subsequently, the electrolyte layer 4c can be provided around the integrated circuit 6 and the top electrode layer 4b can be laid down over the electrolyte layer 4c and the integrated circuit 6.

As further shown in FIG. 6, the integrated circuit 6 can be provided with a dielectric layer 18. The dielectric layer 18 encloses the integrated circuit 6, thereby to electrically isolate the integrated circuit 6 from the electrode layers of the laminated battery 4, and also thereby to protect the integrated circuit 6 from the electrolyte layer 4c.

In order to provide electrical connections betweens the top electrode layer 4b, the bottom electrode layer 4a and the integrated circuit 6, contact portions 20 (for example, vias) can pass through the dielectric layer 18 (and also through portions of the integrated circuit 6 itself, if required).

As described above, the integrated circuit 6 can, in some examples, include some form of sensor. In the examples of FIGS. 1 to 4, the integrated circuit is provided in an opening, thereby to provide the sensor of the integrated circuit with access to the surrounding environment. In the present example shown in FIGS. 5 and 6, however, the integrated circuit 6 does not have direct access to the surrounding environment, since it is covered by the top electrode layer 4b of the laminated battery 4. Nevertheless, the integrated circuit 6 may still be provided with some form of sensor functionality. In particular, sensors which do not expressly require access to the surrounding environment can be used. Examples of such sensors include temperature sensors (which can monitor the temperature of the surrounding environment via the intervening layers of the laminated battery 4), accelerometers, orientation detectors and magnetometers.

Accordingly, there has been described an apparatus comprising a carrier, a laminated battery provided on a major surface of the carrier, and an integrated circuit. The laminated battery includes a bottom electrode layer, an electrolyte layer, and a top electrode layer. The integrated circuit is connected to the bottom electrode layer and the top electrode layer. The integrated circuit is surrounded by the laminated battery on the carrier.

Although particular embodiments of the invention have been described, it will be appreciated that many modifications/additions and/or substitutions may be made within the scope of the claimed invention.

The invention claimed is:

1. Apparatus comprising:
a laminated battery provided on a major surface of a carrier, the laminated battery comprising a bottom electrode layer, an electrolyte layer, and a top electrode layer; and
an integrated circuit (IC) connected to and in contact with the bottom electrode layer and the top electrode layer,
wherein the integrated circuit is located in an opening in the laminated battery and is surrounded by the laminated battery on the major surface of the carrier, and
wherein a portion of the bottom electrode layer and a portion of the top electrode layer each extend into the opening and connect with the integrated circuit in the opening, in which the bottom electrode layer, the electrolyte layer and the top electrode layer are configured and arranged to provide one of:
the portion of the top electrode layer extending from an upper surface of the top electrode layer down into the opening and to the IC, along and in contact with a side portion of the electrolyte layer facing the opening, and
encapsulation of the IC with at least a portion of the top electrode layer lying above the IC and at least a portion of the bottom electrode layer lying below the IC, with the IC being between respective portions of the top electrode layer and of the bottom electrode layer.

2. The apparatus of claim 1, wherein the portions of the electrode layers that extend into the opening in the laminated battery comprise elongated fingers protruding from the electrode layers.

3. The apparatus of claim 1, comprising a flip-chip arrangement, in which the integrated circuit is reverse-mounted on current collectors provided on the major surface of the carrier.

4. The apparatus of claim 1, wherein the integrated circuit comprises a sensor.

5. The apparatus of claim 4, wherein the sensor is exposed to the surrounding environment through the opening in the laminated battery.

6. The apparatus of claim 1, comprising an isolation layer located between the carrier and the bottom electrode of the laminated battery.

7. The apparatus of claim 1, wherein the carrier comprises a Polyethylene terephthalate (PET), polyaryletheretherketone (PEEK), Polyvinyl chloride (PVC) or Polyimide foil.

8. A radio-frequency identification (RFID) tag comprising the apparatus of claim 1.

9. A microelectromechanical system (MEMS) device comprising the apparatus of claim 1.

10. The apparatus of claim 1, wherein the portion of the top electrode layer extends from the upper surface of the top electrode layer down into the opening and to the IC, along and in contact with the side portion of the electrolyte layer facing the opening, and has a thickness that is consistent with a thickness of a portion of the top electrode layer that lies on an upper surface of the electrolyte layer.

11. The apparatus of claim 1, wherein
the IC has an upper surface and a lower surface, and
the top electrode layer, the bottom electrode layer and the electrolyte layer encapsulate the IC, with the top electrode layer an entire upper surface of the IC and the bottom electrode layer lying below an entire lower surface of the IC.

12. The apparatus of claim 1,
wherein the IC has an upper surface and a lower surface,
wherein the top electrode layer, the bottom electrode layer and the electrolyte layer encapsulate the IC, with the top electrode layer lying over the entire upper surface of the IC and the bottom electrode layer lying below the entire lower surface of the IC, and
further including
an insulating layer between the IC and the top electrode layer, the bottom electrode layer and the electrolyte layer, the insulating layer being configured and arranged to electrically insulate the IC from each of the top electrode layer, the bottom electrode layer and the electrolyte layer,
a first contact extending from the top electrode layer, through the insulating layer to a contact of the IC below the top electrode layer, the first contact being configured and arranged to electrically connect the top electrode layer to the IC, and
a second contact extending from the bottom electrode layer, through the insulating layer and to a contact of the IC above the bottom electrode layer, the second contact being configured and arranged to electrically connect the bottom electrode layer to the IC.

13. An apparatus comprising:
a carrier having a major surface;
a laminated battery on the major surface and including a bottom electrode layer, a top electrode layer, and an electrolyte layer between the bottom electrode layer and the top electrode layer, the laminated battery having sidewalls that define an opening laterally surrounded by the sidewalls;
an integrated circuit (IC) located in the opening and laterally surrounded by the sidewalls, the top and bottom electrode layers being configured and arranged to encapsulate the IC with at least a portion of the top electrode layer lying directly above the IC and at least a portion of the bottom electrode layer lying directly below the IC;
a first conductor electrically connecting the top electrode layer to the IC, the first conductor including a portion of the top electrode layer that defines the sidewall of the opening; and
a second conductor electrically connecting the bottom electrode layer to the IC.

14. The apparatus of claim 13, wherein the first conductor extends along and in contact with a side portion of the electrolyte layer that faces the opening.

15. The apparatus of claim 13, wherein the first conductor includes a portion of the top electrode layer that extends from an upper surface of the top electrode layer down into the opening and to the IC, along and in contact with a side portion of the electrolyte layer facing the opening, and has a thickness that is consistent with a thickness of a portion of the top electrode layer that lies on an upper surface of the electrolyte layer.

16. An apparatus comprising:
a carrier having a major surface;
a laminated battery on the major surface and including a bottom electrode layer, a top electrode layer, and an electrolyte layer between the bottom electrode layer and the top electrode layer, the laminated battery having sidewalls that define an opening laterally surrounded by the sidewalls;

an integrated circuit (IC) located in the opening and laterally surrounded by the sidewalls, the top and bottom electrodes being configured and arranged to encapsulate the IC with at least a portion of the top electrode layer lying directly above the IC and at least a portion of the bottom electrode layer lying directly below the IC, the IC being between respective portions of the top electrode layer and of the bottom electrode layer;

a first conductor electrically connecting the top electrode layer to the IC; and a second conductor electrically connecting the bottom electrode layer to the IC.

17. The apparatus of claim 16, further including an insulating layer between the IC and the top electrode layer, the bottom electrode layer and the electrolyte layer, the insulating layer being configured and arranged to electrically insulate the IC from each of the top electrode layer, the bottom electrode layer and the electrolyte layer, and wherein the top electrode layer lies over an entire upper surface of the IC, the bottom electrode layer lies below an entire lower surface of the IC, the first conductor extends from the top electrode layer, through the insulating layer to a contact of the IC below the top electrode layer, and the second conductor extends from the bottom electrode layer, through the insulating layer and to a contact of the IC above the bottom electrode layer.

\* \* \* \* \*